(12) United States Patent
Akikuni et al.

(10) Patent No.: US 6,403,946 B1
(45) Date of Patent: Jun. 11, 2002

(54) ELECTRO-OPTIC SAMPLING PROBE COMPRISING PHOTODIODES INSULATED FROM MAIN FRAME OF EOS OPTICAL SYSTEM

(75) Inventors: Fumio Akikuni; Katsushi Ohta, both of Tokyo; Tadao Nagatsuma, Sagamihara; Mitsuru Shinagawa, Isehara; Junzo Yamada, Ebina, all of (JP)

(73) Assignees: Ando Electric Co., Ltd.; Nippon Telegraph and Telephone Corporation, both of Tokyo (JP)

( * ) Notice: Subject to any disclaimer, the term of this patent is extended or adjusted under 35 U.S.C. 154(b) by 0 days.

(21) Appl. No.: 09/513,788

(22) Filed: Feb. 25, 2000

(30) Foreign Application Priority Data

Mar. 24, 1999 (JP) ............................ 11-080543

(51) Int. Cl.$^7$ ............................................ G01R 31/303
(52) U.S. Cl. ........................ 250/225; 250/239; 324/753
(58) Field of Search ............................. 250/225, 234, 250/239, 201.1; 324/750, 752, 753, 96; 257/687, 692

(56) References Cited

U.S. PATENT DOCUMENTS

| | | | |
|---|---|---|---|
| 4,253,061 A | 2/1981 | Ono et al. | ............... 324/96 |
| 5,479,106 A | 12/1995 | Takahashi et al. | .......... 324/753 |
| 5,808,473 A | 9/1998 | Shingawa et al. | .......... 324/753 |
| 6,034,424 A | * 3/2000 | Fujimura et al. | ........... 257/696 |

FOREIGN PATENT DOCUMENTS

| | | | |
|---|---|---|---|
| EP | 0 505 185 A1 | 3/1992 | ......... G01R/33/032 |
| EP | 0581556 | 2/1994 | ......... G01R/31/308 |

* cited by examiner

Primary Examiner—Kevin Pyo
(74) Attorney, Agent, or Firm—Darby & Darby

(57) ABSTRACT

An electro-optic sampling probe for preventing noise from being transmitted to photodiodes and improving the measurement accuracy is disclosed. In the probe, the optical system module comprises wavelength plates and polarized beam splitters arranged along an optical path of the relevant laser beam, and photodiodes facing the polarized beam splitters, wherein each photodiode is fixed via an insulating material to the main frame of the optical system module.

3 Claims, 10 Drawing Sheets

ELECTRO-OPTIC SAMPLING PROBE COMPRISING PHOTODIODES INSULATED FROM MAIN FRAME OF EOS OPTICAL SYSTEM

BACKGROUND OF THE INVENTION

1. Field of the Invention

The present invention relates to an electro-optic sampling probe (or prober) in which an electric field generated by a target signal to be measured is applied to an electro-optic crystal, and an optical pulse signal generated based on a timing signal is incident onto the electro-optic crystal, and the waveform of the target signal is observed according to the polarization state of the incident optical pulse signal. In particular, the present invention relates to a technique for improving the S/N ratio of the probe.

This application is based on Patent Application No. Hei 11-80543 filed in Japan, the contents of which are incorporated herein by reference.

2. Description of the Related Art

In a conventional technique, the waveform of a target signal (to be measured) can be observed by applying an electric field generated by the target signal to an electro-optic crystal; inputting a laser beam to the electro-optic crystal, and observing the waveform of the target signal according to the polarization state of the laser beam. If a pulsed laser beam is used for sampling the target signal, the measurement can be performed with a very high temporal resolution. The electro-optic sampling probe (abbreviated to "EOS probe", hereinbelow) employs an electro-optic probe having the above function.

In comparison with the conventional probes employing known electric probes, the above EOS probe has the following characteristics and thus has received widespread notice:

(1) A ground line is unnecessary for measuring the signal; thus, the measurement can be easily performed.

(2) The tip of the electro-optic probe is insulated from the circuit; thus, a high input impedance can be obtained and (the state of) the point to be measured is not significantly disturbed.

(3) An optical pulse signal is used; thus, wide-band measurement of a GHz order can be performed.

(4) An electro-optic crystal can be made to contact a wafer of an IC (or the like), and the laser beam can be made to converge on the wiring printed on the IC wafer, thereby enabling the measurement of thin wiring which a metallic pin cannot physically contact.

In the following explanations, the units for the optical wavelength are "nm".

The structure of a conventional EOS probe will be explained with reference to FIG. 11. In FIG. 11, reference numeral 1 indicates an IC wafer connected to an external device via a power supply line and a signal line. Reference numeral 2 indicates an electro-optic element using an electro-optic crystal. Reference numeral 3 indicates an objective used for converging the beam incident on the electro-optic element 2. Reference numeral 4 indicates the (main) body of the probe, comprising a dichroic mirror 4a, a half mirror 4b, and a reflecting mirror 4c. Reference numeral 6 indicates an EOS optical system module (called "EOS optical system", hereinbelow) comprising a photodiode, a polarized beam splitter, a wave plate, and so on.

Reference numeral 7 indicates an optical fiber, to one end of which fiber collimator 7a is connected. Reference numeral 8 indicates a laser light source for supplying a laser beam to the EOS optical system. The wavelength of the outgoing laser beam having a maximum light intensity is 1550 nm. Reference numeral 9 indicates a halogen lamp for irradiating IC wafer 1 to be measured. The halogen lamp 9 may be replaced with a xenon or tungsten lamp, or the like.

Reference numeral 10 indicates an infrared camera (abbreviated to "IR camera", hereinbelow) for confirming the positioning for converging a beam onto the target wiring provided on the IC wafer 1. The image obtained by the camera is displayed on monitor 10a. The IR camera 10 has a light receiving sensitivity within a wavelength range from 500 to 1800 nm. Reference numeral 11 indicates a suction stage for fixing the IC wafer 1, which can be finely moved in the x, y, and z directions (perpendicular to each other).

FIG. 12 is a diagram showing the general structure of the EOS optical system 6. The basic structural elements of the EOS optical system 6 are a polarized beam splitter, a wave plate, and a photodiode. However, the structure as shown in FIG. 12 can reduce the noise and improve the sensitivity, thus is preferable in practical use.

As shown in FIG. 12, in the EOS optical system 6, optical path 13 is provided inside main frame 12, and half-wave plates 14 and 15, a quarter-wave plate 16, polarized beam splitters 17 and 18, and a Faraday element 19 are arranged along the optical path 13.

In addition, photodiodes 22 and 23 are provided in a manner such that they respectively face polarized beam splitters 17 and 18, as shown in FIG. 12. These photodiodes 22 and 23 are attached to the main frame 12.

Below, the optical path of the laser beam emitted from the laser light source 8 will be explained with reference to FIG. 11. In FIG. 11, the laser optical path inside the probe body 4 is indicated by reference numerals A, B, and C.

The laser beam emitted from the laser light source 8 is transmitted through optical fiber 7, and is collimated by fiber collimator 7a. This collimated beam then passes through optical path 13 in the EOS optical system 6 (see FIG. 12), and is input into the probe body 4 (refer to optical path A in FIG. 11). This input beam is deflected by 90 degrees by reflecting mirror 4c (refer to optical path B in FIG. 11). The reflecting mirror 4c used here is a total reflection mirror manufactured by depositing aluminum (or the like) on a surface of a glass material.

The laser beam deflected by 90 degrees by reflecting mirror 4c is further deflected by 90 degrees by dichroic mirror 4a (refer to optical path C in FIG. 1), and then converged by objective 3 onto a face of the electro-optic element 2 disposed on the wiring on the IC wafer 1, the face facing the IC wafer 1.

FIG. 13 shows an optical characteristic of dichroic mirror 4a. In this figure, the x-axis indicates wavelength, and the y-axis indicates transmittance. As shown in FIG. 13, the dichroic mirror 4a has the characteristic of transmitting 5% (and reflecting 95%) of a beam having a wavelength of 1550 nm. Therefore, 95% of the beam emitted from the laser source is reflected and deflected by 90 degrees.

A dielectric mirror 2a (functioning as a reflecting film) is deposited on the face (which faces the IC wafer 1) of the electro-optic element 2. The laser beam reflected by this face is again collimated by objective 3 and returns to the EOS optical system 6 through the optical paths C, B, and A (in this order). Some portions of the reflected beam are then isolated by isolator 20, and they are incident on photodiodes 22 and 23 and converted into electrical signals.

Below, the operation of measuring a target signal (to be measured) using the EOS probe having the above structure will be explained.

When a voltage is applied to the target wiring on the IC wafer 1, the corresponding electric field is applied to the electro-optic element 2, and the refractive index thereof is then changed due to the Pockels effect. As explained above, the laser beam emitted from the laser light source 8 is incident on the electro-optic element 2, and is reflected by dielectric mirror 2a and returned through the same optical path. According to the above effect, the polarization state of the beam output from the electro-optic element 2 is changed. This laser beam having a changed polarization state is again incident on the EOS optical system 6 via optical paths C, B, and A.

In the EOS optical system 6, the change of the polarization state of this incident laser beam is converted into a change of light intensity, which is detected by photodiodes 22 and 23 so as to convert them into electric signals. These electric signals are processed by a signal processing section (not shown), thereby measuring the electric signal applied to the target wiring on the IC wafer 1.

In the above conventional structure, the photodiodes 22 and 23 for detecting and outputting the change of the light intensity as electric signals are fixed to main frame 12 of the EOS optical system 6. Therefore, a change of the electromagnetic field in the IC wafer 1 or around the EOS probe, or the like, may be transmitted via the main frame to photodiodes 22 and 23 and the change may be detected as noise, thereby reducing the S/N ratio.

SUMMARY OF THE INVENTION

In consideration of the above circumstances, an object of the present invention is to provide an EOS probe for preventing the noise from being transmitted to the photodiodes and improving the measurement accuracy.

Therefore, the present invention provides an electro-optic sampling probe comprising:

a laser light source for emitting a laser beam according to a control signal from a main body of the electro-optic sampling probe;

an electro-optic element which contacts wiring on an IC wafer to be measured, and whose optical characteristics change according to the variation of an electric field generated by the variation of a voltage applied to the wiring; and a reflecting film provided on a face of the electro-optic element, the face facing the wiring, and wherein:

the laser beam emitted from the laser light source passes through the electro-optic element, and then is reflected by the reflecting film;

the reflected beam passes through an optical path in a main frame of an optical system module wherein some portions of the reflected beam are isolated by the optical system module and are converted into electric signals; and the optical system module comprises wavelength plates and polarized beam splitters arranged along the optical path, and photodiodes facing the polarized beam splitters, wherein each photodiode is fixed via an insulating material to the main frame of the optical system module.

Preferably, the optical system module has a wiring section for holding a lead terminal connected with the photodiode and a connector to which the lead terminal is connected; and the wiring section and the connector are insulated from the main frame.

According to the above structure, it is possible to prevent a change of the electric field around the IC wafer and EOS probe from being transmitted to the photodiode and related lead terminal and connector in the (EOS) optical system module. Therefore, such a change is not detected as noise by the photodiode, thereby improving the measurement accuracy.

DESCRIPTION OF THE PREFERRED EMBODIMENTS

Figure 1:
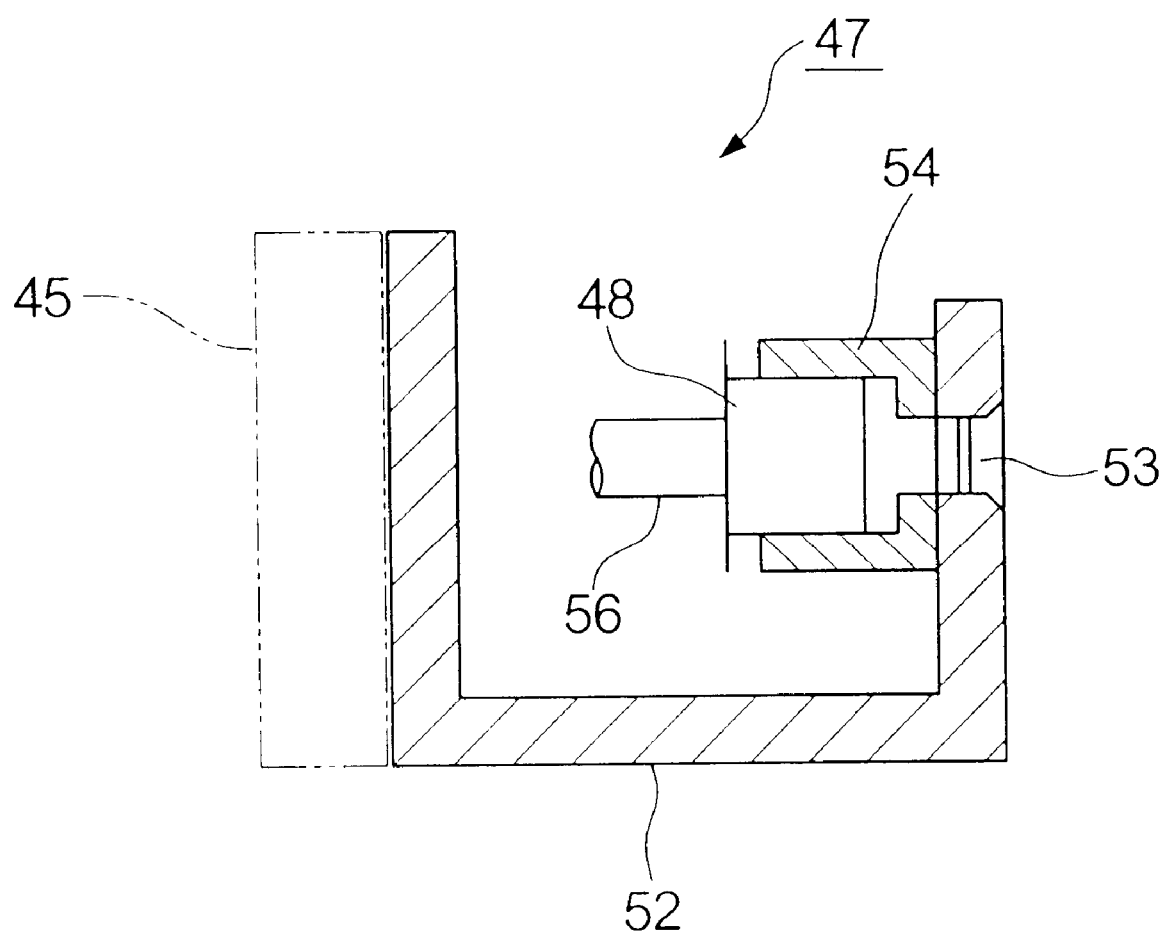
FIG. 1 is an enlarged cross-sectional elevation view of the PD stage attaching section of the electro-optic sampling (EOS) probe as an embodiment according to the present invention.

Hereinafter, an embodiment of the EOS (electro-optic sampling) probe according to the present invention will be explained in detail with reference to the drawings.

The basic structure of this embodiment is the same as that of the above-explained conventional EOS probe; thus, the differences will be mainly explained below, and parts identical to those of the conventional structure are given identical reference numerals and explanations thereof are omitted.

Figure 2:
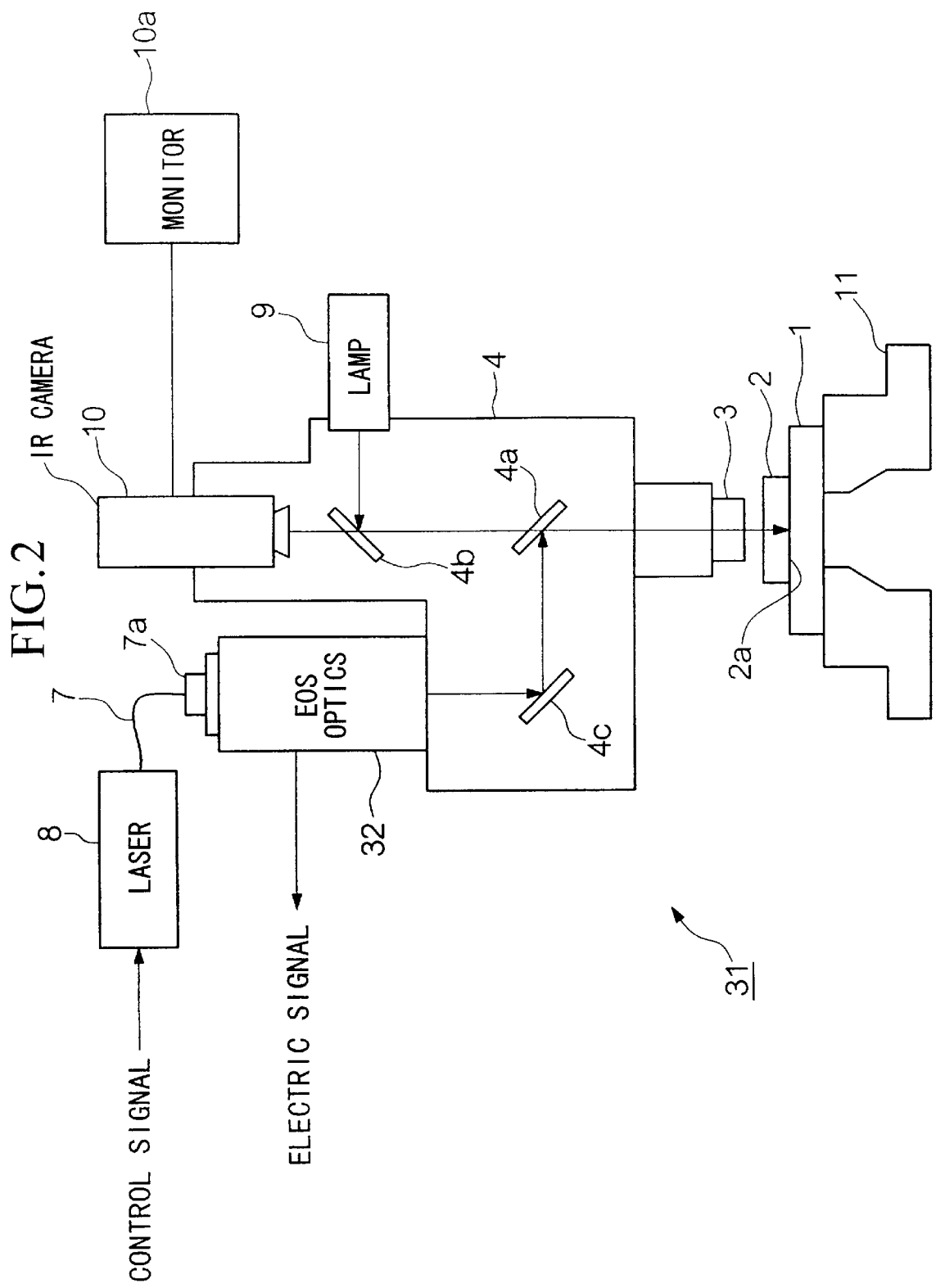
FIG. 2 is a diagram showing the general structure of the EOS probe of the embodiment.

As shown in FIG. 2, the EOS probe 31 of the present embodiment comprises laser light source 8 and electro-optic element 2 which contacts the wiring on IC wafer 1 to be measured, and the optical characteristics of the element 2 change according to the variation of the electric field generated by the variation of the voltage applied to the wiring.

A dielectric mirror (or reflecting film) 2a is provided on a face (of the electro-optic element 2) which faces the above wiring. The laser beam emitted from the laser light source 8 towards the electro-optic element 2 passes through the element 2 and then is reflected by the dielectric mirror 2a. Some portions of this reflected beam are isolated in the EOS optical system 32 and are converted to electric signals.

Figure 3:
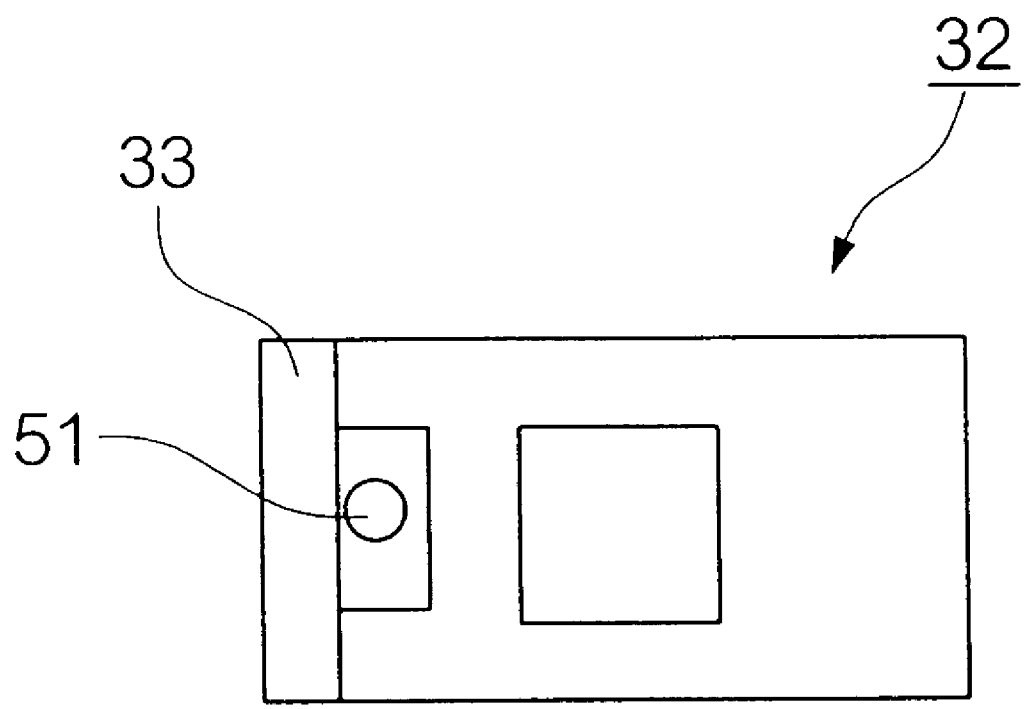
FIG. 3 is a plan view of the EOS optical system of the EOS probe shown in FIG. 2.
Figure 4:
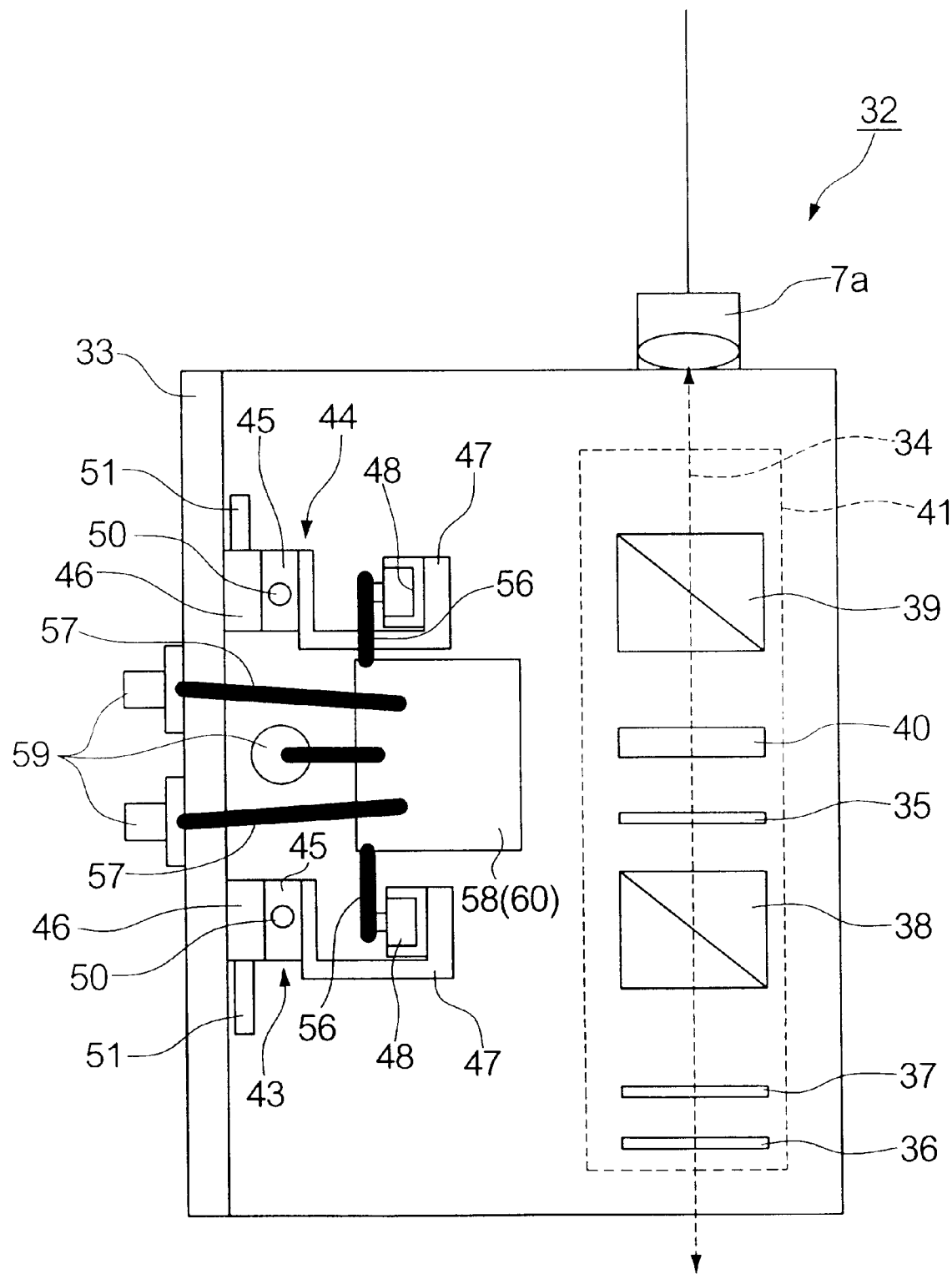
FIG. 4 is a cross-sectional elevation view of the EOS optical system.
Figure 5:
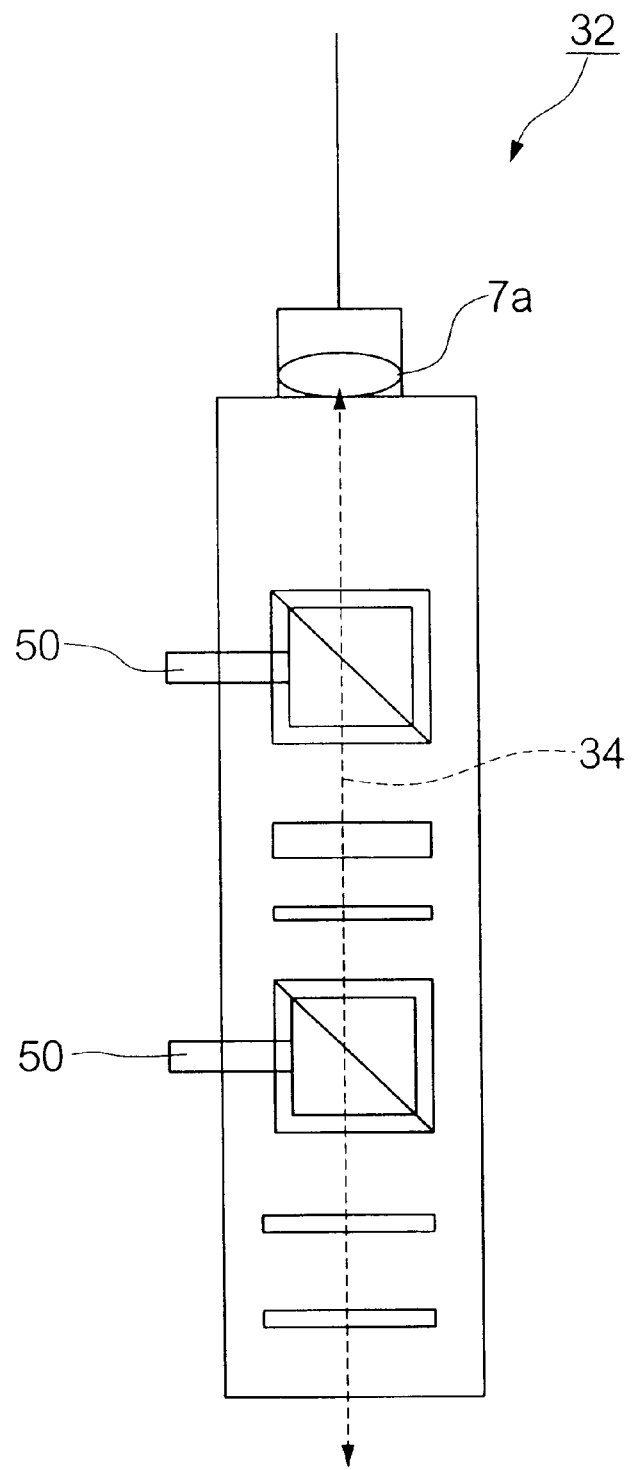
FIG. 5 is a cross-sectional side view of the EOS optical system.

FIGS. 3, 4, and 5 are a plan view, cross-sectional elevation view, and cross-sectional side view, respectively, which show the detailed structure of the EOS optical system 32. In the EOS optical system 32, the optical path 34 for transmitting the incident beam from the laser light source 8 and the reflected beam from the electro-optic element 2 is provided inside main frame 33. Half-wave plates 35 and 36, a quarter-wave plate 37, polarized beam splitters 38 and 39, and a Faraday element 40 are arranged along the optical path 34. The above structural elements form the optical isolator 41.

Additionally, photodiode holding sections 43 and 44, which respectively face polarized beam splitters 38 and 39 at the optical path side, are provided as shown in FIG. 4.

These photodiode holding sections 43 and 44 are attached to the main frame 33 of the EOS optical system 32. Each of the photodiode holding sections comprises X-axis stage 45, Y-axis stage 46, PD stage attaching section 47, and photodiode 48.

Each of the X-axis stage 45 and Y-axis stage 46 has adjustment screws 50 and 51. Here, it is assumed that the Z-axis is the direction from polarized beam splitter 38 to corresponding photodiode 48, or from polarized beam splitter 39 to corresponding photodiode 48. By rotating the adjustment screws 50 and 51, the position of the PD stage attaching section 47 can be finely adjusted in the X-axis and Y-axis directions.

FIG. 1 shows the structure of the PD stage attaching section 47. As shown by the figure, this section comprises PD stage attaching plate 52 fixed to the X-axis stage 45, lens 53 fixed to the PD stage attaching plate 52, and PD holder 54 for fixing photodiode 48 to a position which faces the lens 53.

Figure 6:
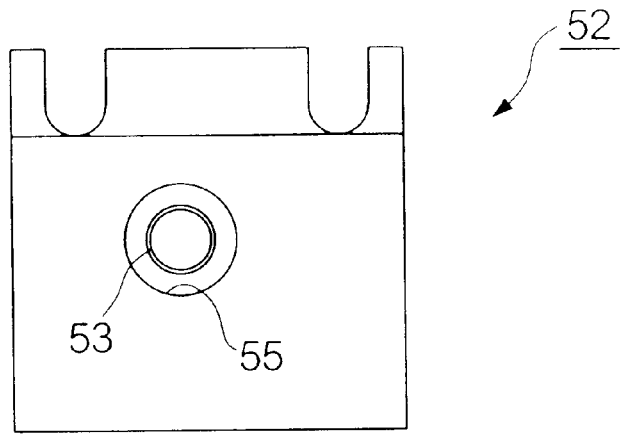
FIG. 6 is a side view of the PD stage attaching plate of the PD stage attaching section shown in FIG. 1.
Figure 7:
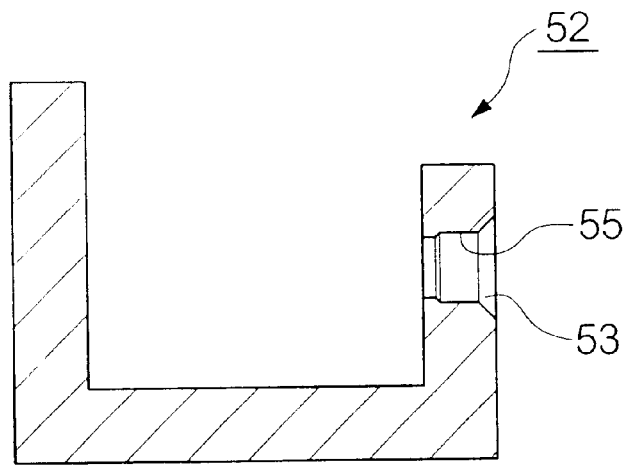
FIG. 7 is a cross-sectional elevation view of the PD stage attaching plate.
Figure 8:
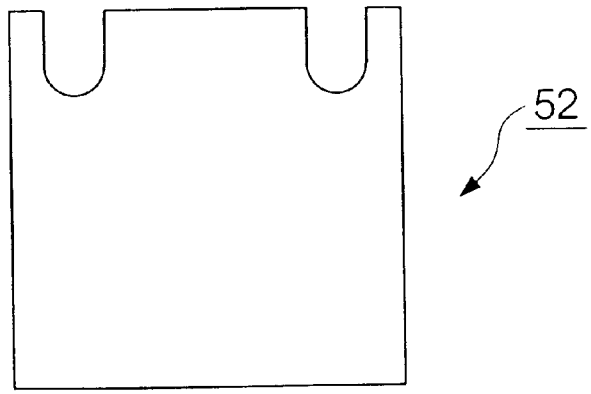
FIG. 8 is a side view of the PD stage attaching plate observed from the opposite direction with respect to FIG. 6.
Figure 9:
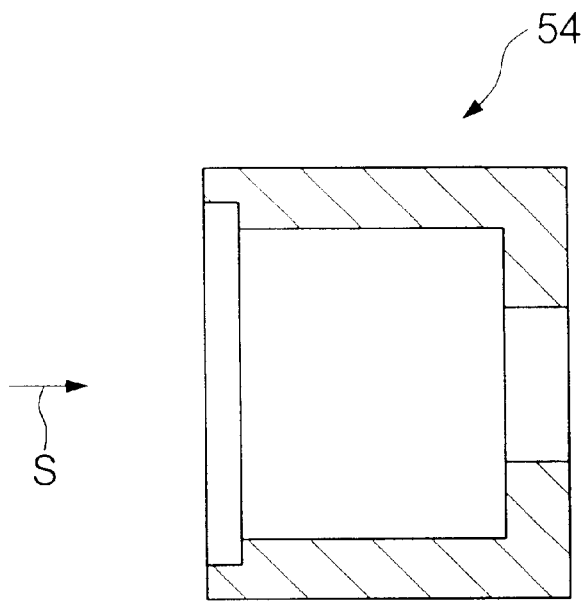
FIG. 9 is a cross-sectional elevation view of the PD holder of the PD stage attaching section shown in FIG. 1.
Figure 10:
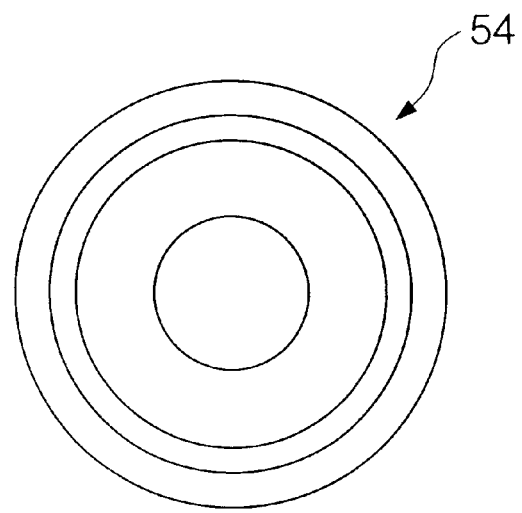
FIG. 10 is a side view of the PD holder observed from direction S in FIG. 9.
Figure 11:
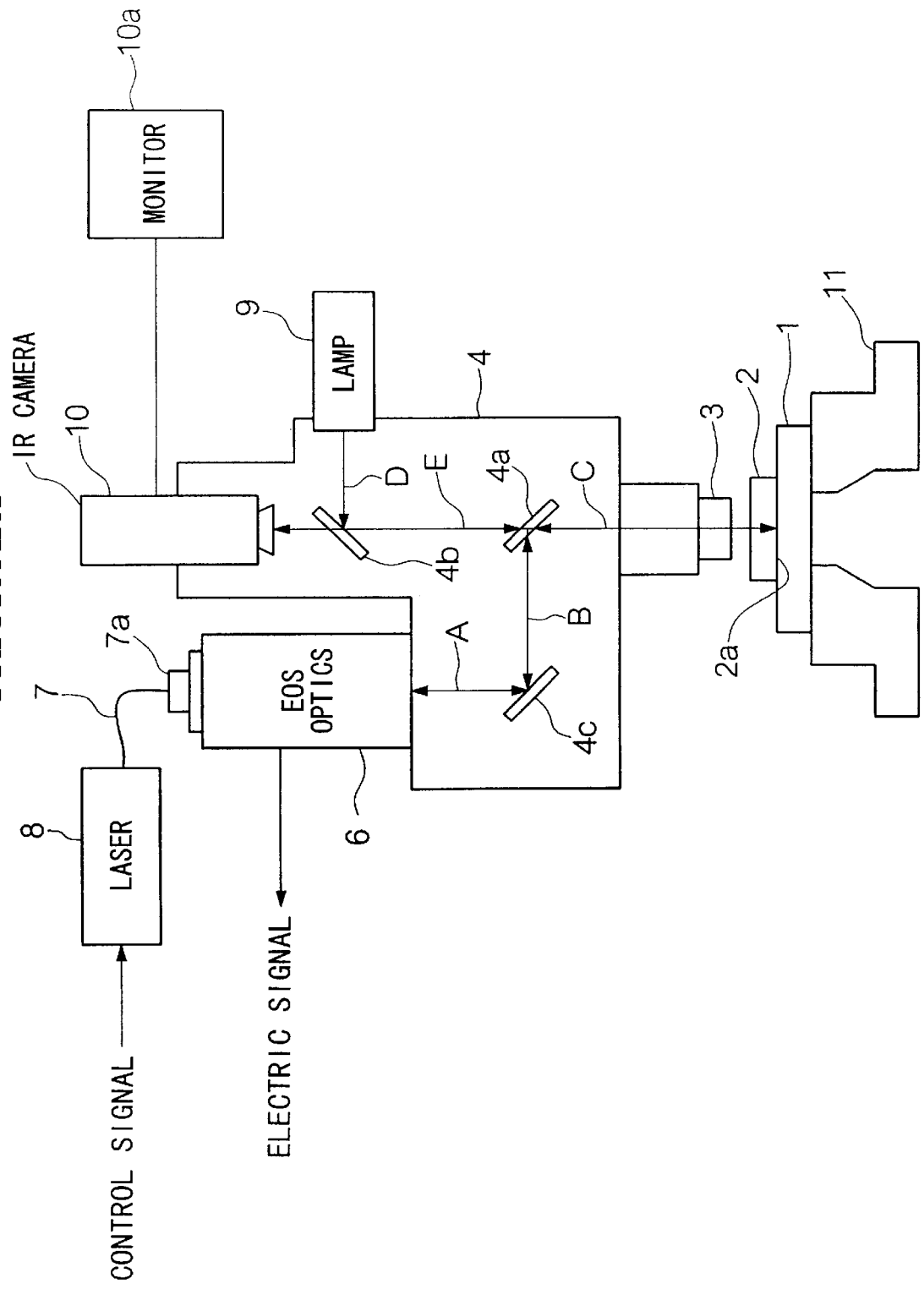
FIG. 11 is a diagram showing the general structure of a conventional EOS probe.
Figure 12:
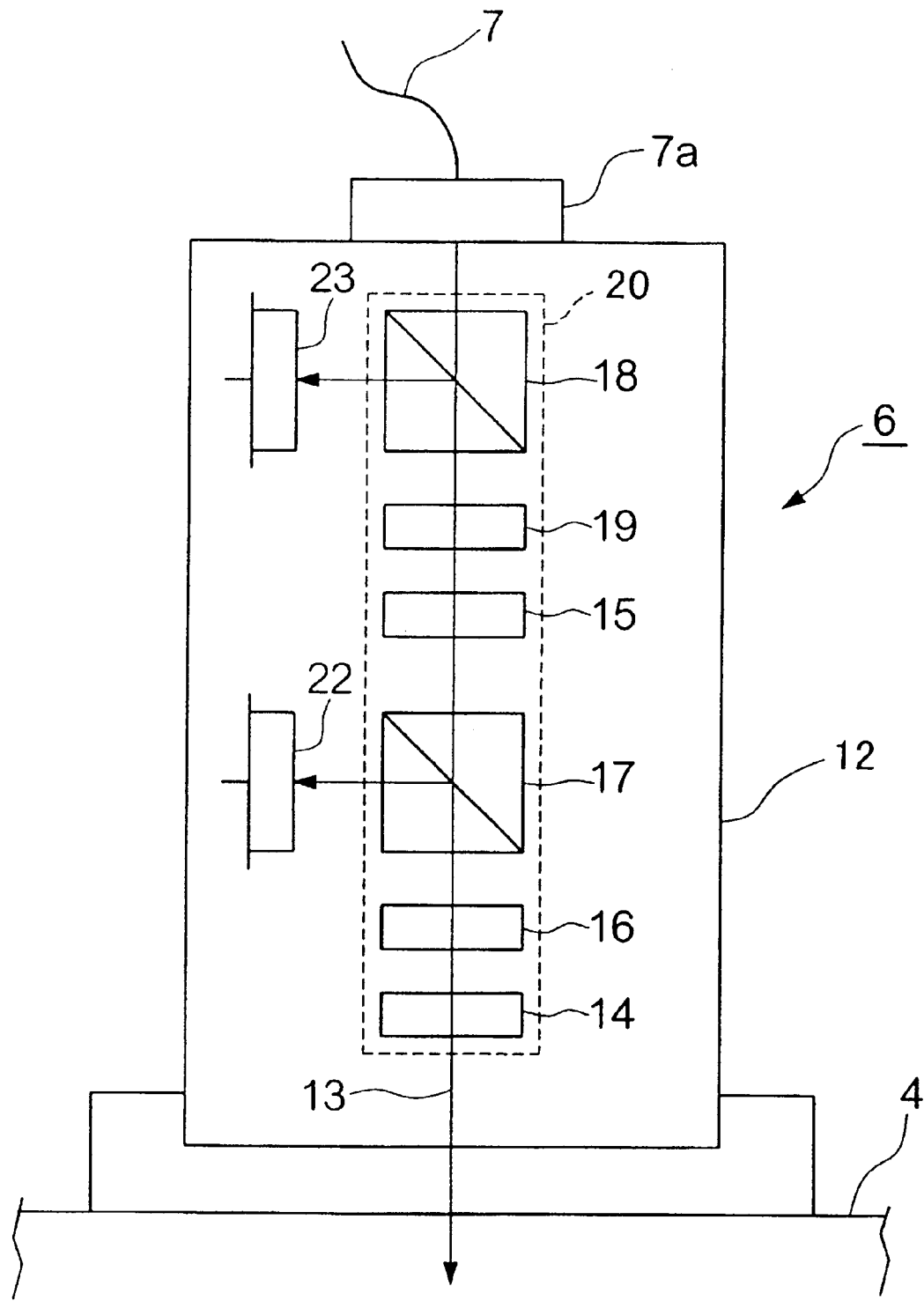
FIG. 12 is a diagram showing the general structure of the EOS optical system of the EOS probe shown in FIG. 11.
Figure 13:
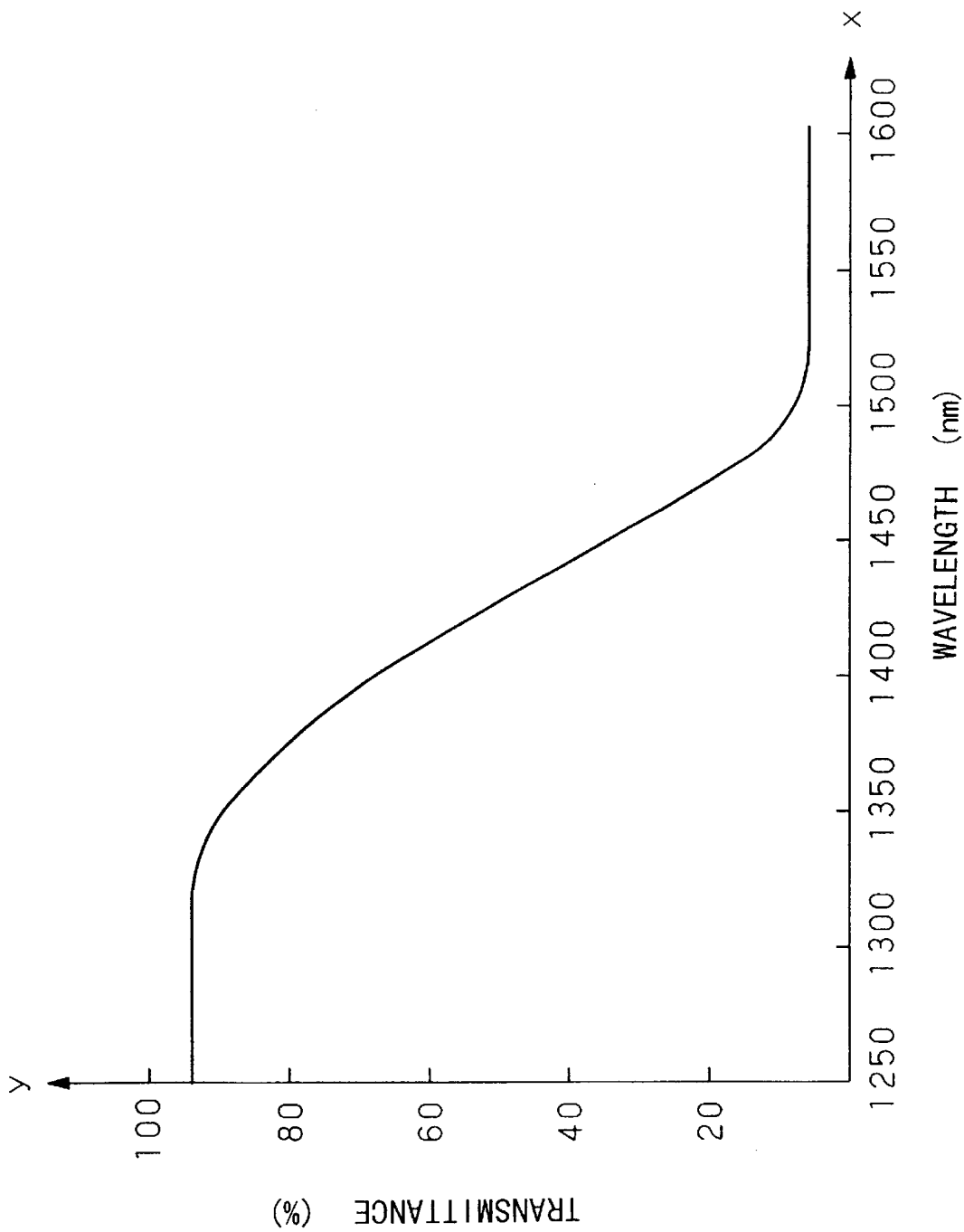
FIG. 13 is a graph diagram of a characteristic curve showing the relationship between the wavelength (x-axis) and the transmittance (y-axis) of an incident beam with respect to the dichroic mirror used in the EOS probe shown in FIG. 11.

As shown in FIGS. 6, 7, and 8, the PD stage attaching plate 52 is a member whose cross-section has a square-bracket shape, and has a lens attachment hole 55 is provided in a position which faces the polarized beam splitter 38 or 39 (see FIG. 4). The lens 53 is attached onto the lens attachment hole 55. As shown in FIG. 1, the PD holder 54 is attached in a manner such that the lens 53 is positioned between the PD holder 54 and the polarized beam splitter 38 or 39, and the PD holder 54 has a cylindrical shape (as shown in FIGS. 9 and 10). The photodiode 48 can be held by the PD holder 54. The above PD stage attaching plate 52 and the PD holder 54 are made of ceramics, an insulating material.

As shown in FIG. 4, coaxial cable 56 connected to photodiode 48 is connected with lead terminal 57. The lead terminal 57 is held by wiring section 58 and is connected to connecting sections 59.

The wiring section 58 is realized by an insulating plate 60 made of glass epoxy resin, ceramics, or the like. Each connecting section 59 has a connecter (not shown) in the center of its area, and is made of an insulating material such as ceramics or plastics. Accordingly, the above wiring section 58 and connectors can also be insulated from the main frame 33 side.

Below, the operation of measuring a target signal (to be measured) of the IC wafer 1 will be explained.

The laser beam emitted from the laser light source 8 passes through the optical fiber 7, and is collimated by fiber collimator 7a. This collimated beam then passes through optical isolator 41 and is output from the EOS optical system 32 and then input into the probe body 4.

The laser beam input into the probe body 4 is deflected by 90 degrees by reflecting mirror 4c, and is further deflected by 90 degrees by dichroic mirror 4a. The beam is then converged by objective 3 onto a face (including the target wiring) of the electro-optic element 2 disposed on the wiring on the IC wafer 1, the face facing the IC wafer 1.

According to the voltage applied to the wiring, the corresponding electric field is applied to the electro-optic element 2, and the refractive index thereof is then changed due to the Pockels effect. Therefore, when the laser beam input into the electro-optic element 2 is transmitted through the element 2, the polarization state of the laser beam is changed. This laser beam having a changed polarization state is reflected by the reflecting film 2a on the surface of the electro-optic element 2 arranged on the wiring of IC wafer 1. This reflected beam then reversely proceeds through the same optical path (through which the beam was incident on the element 2), and is incident on the EOS optical system 32. Some portions of this incident laser beam are isolated by optical isolator 41, and the isolated portions are then input via lenses 53, 53 to photodiodes 48, 48 so that they are converted into electric signals. Each signal is output via coaxial cable 56, lead terminal 57, and a connector (not shown) held by connecting section 59 to a signal processing section not shown.

According to the variation of the voltage of the measurement portion (i.e., the wiring on IC wafer 1), the change of the polarization state caused by the electro-optic element 2 is detected as a difference between the electric signals output from the photodiodes (48, 48), thereby measuring the electric signal transmitted through the wiring on the IC wafer 1.

Here, the PD stage attaching plate 52 and PD holder 54 for holding photodiode 48 and lens 53 are made of ceramics; thus, it is possible to prevent a change of the electromagnetic field in the IC wafer 1 or around the EOS probe 31 from being transmitted via the main frame 33 of the EOS optical system 32 to photodiode 48. Accordingly, it is possible to prevent such a change from being detected as a noise and to improve the measurement accuracy.

In addition, the wiring section 58 and connecting sections 59 are also made of insulating materials; thus, a change of the electromagnetic field is not transmitted via the main frame 33 to lead terminal 57 and relevant connectors, thereby preventing a noise from being included in the measurement result obtained by the photodiodes 48. Accordingly, the measurement accuracy can be further improved.

Any variation related to the above embodiment is possible within the spirit and scope of the present invention.

For example, the PD holder 54 and PD stage attaching plate 52 for holding photodiode 48 and lens 53 are made of ceramics in the above embodiment. However, a resin material such as a phenolic resin or polyacetal resin may be used. In this case, the PD holder 54 and PD stage attaching plate 52 can be much more easily made.

Another insulating material may be used for the PD holder 54 and PD stage attaching plate 52.

In addition, the insulating plate 60 functioning as the wiring section 58 and the connecting sections 59 may be made of an insulating material different from that explained above.

What is claimed is:

1. An electro-optic sampling probe comprising:
    a laser light source for emitting a laser beam according to a control signal from a main body of the electro-optic sampling probe;
    an electro-optic element having a reflecting film on one face adapted to oppose wiring on an IC wafer to be measured, and whose optical characteristics change according to the variation of an electric field generated by the variation of a voltage applied to the wiring, and wherein:

the laser beam emitted from the laser light source passes through the electro-optic element, and then is reflected by the reflecting film, the reflected beam passes through an optical path in a main frame of an optical system module wherein portions of the reflected beam are isolated by the optical system module and are converted into electric signals; and the optical system module comprises wavelength plates and polarized beam splitters arranged along the optical path, and photodiodes respectively facing the polarized beam splitters; and a photodiode holding member of an electrical insulating material attached to the main frame of the optical system module for holding the photodiode so as to prevent a change of the electromagnetic field in the IC wafer or around the electro-optic sampling probe from being transmitted via the main frame to a photodiode.

2. An electro-optic sampling probe as claimed in claim 1, wherein the optical system module has a wiring section for holding a lead terminal connected with the photodiode and a connector to which the lead terminal is connected; and the wiring section and the connector are electrically insulated from the main frame.

3. An electro-optic sampling probe as claimed in claim 1, wherein the photodiode holding member has a lens attachment hole, and the laser beam from each polarized beam splitter is incident on each photodiode via a lens attached to the lens attachment hole.

* * * * *